United States Patent [19]

Ehlinger et al.

[11] Patent Number: 4,760,587
[45] Date of Patent: Jul. 26, 1988

[54] DEVICE FOR TRANSMITTING HIGH-FREQUENCY PULSES IN A CERTAIN PATTERN AND A RADIO-NAVIGATION SYSTEM INCLUDING SUCH A DEVICE

[75] Inventors: Dominique Ehlinger, Meudon; Jean-Pierre Susset, Buc, both of France

[73] Assignee: U. S. Philips Corporation, New York, N.Y.

[21] Appl. No.: 879,656

[22] Filed: Jun. 27, 1986

[30] Foreign Application Priority Data

Jul. 2, 1985 [FR] France ................. 85 10061

[51] Int. Cl.⁴ ................. H04L 27/04; H04B 1/04
[52] U.S. Cl. ................. 375/59; 455/126; 342/145; 375/60
[58] Field of Search ......... 375/37, 59, 4, 41, 60; 455/113, 119, 126, 44; 342/145; 371/24, 71

[56] References Cited

U.S. PATENT DOCUMENTS

| | | | |
|---|---|---|---|
| 4,068,173 | 1/1978 | Weise | 455/119 |
| 4,412,337 | 10/1983 | Bickley et al. | 455/126 |
| 4,485,349 | 11/1984 | Siegel et al. | 455/126 |
| 4,592,073 | 5/1986 | Watanabe | 375/60 |
| 4,706,262 | 11/1987 | Ohta | 375/60 |

FOREIGN PATENT DOCUMENTS 0096820  6/1983  Fed. Rep. of Germany.

*Primary Examiner*—Robert L. Griffin
*Assistant Examiner*—Marianne Huseman
*Attorney, Agent, or Firm*—Thomas A. Briody; Algy Tamoshunas; William J. Streeter

[57] ABSTRACT

This device comprises a high-frequency signal generator (5) fitted with a modulation control input (10) to supply said pulses at its output in relation to a modulation signal applied to its modulation input and a modulation generator (15) to provide the modulation input with the modulation signal. This device also includes a replica circuit (18) to supply a replica of the pulse transmitted, a management circuit (25) to compare this replica wtih said pattern and to alter the modulation signal from the modulation generator so that the pattern complies with the replica.

10 Claims, 11 Drawing Sheets

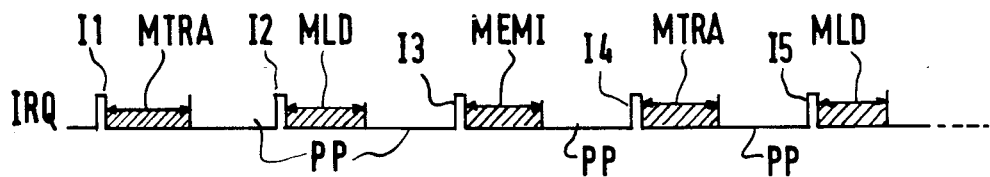
FIG.3
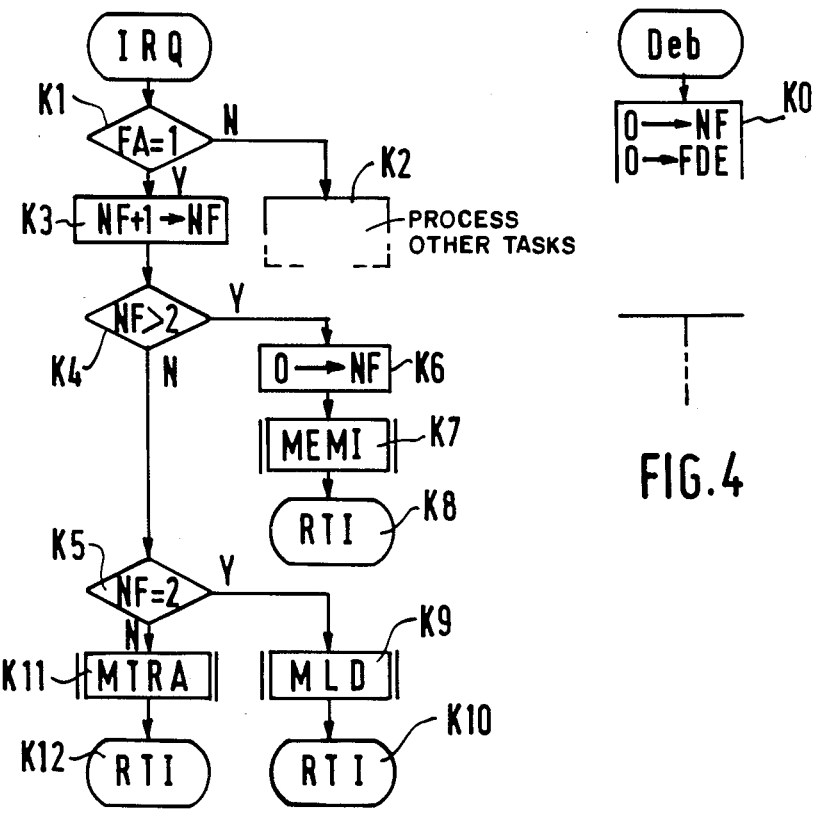
FIG.4
FIG.5

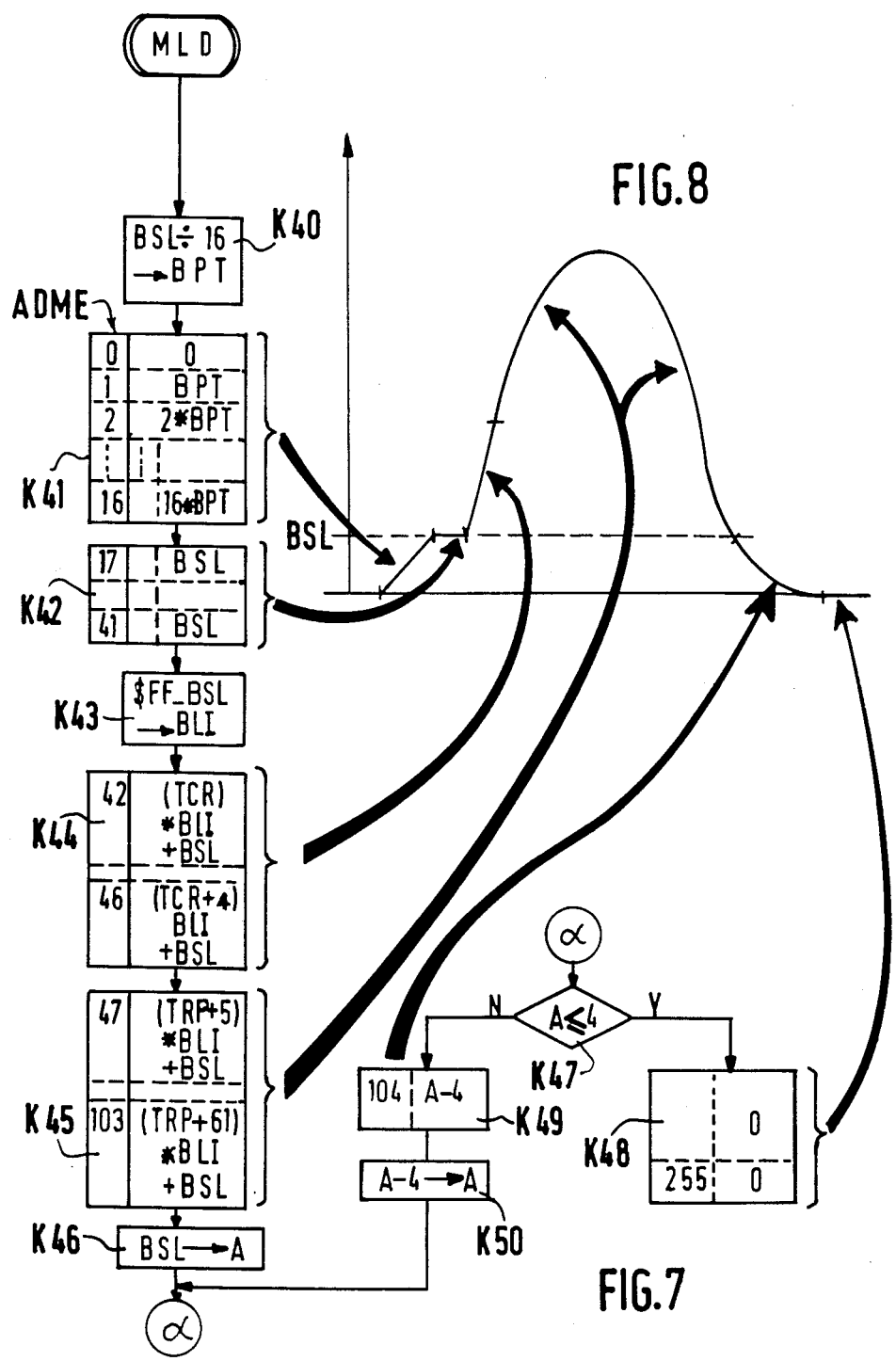

DEVICE FOR TRANSMITTING HIGH-FREQUENCY PULSES IN A CERTAIN PATTERN AND A RADIO-NAVIGATION SYSTEM INCLUDING SUCH A DEVICE

This invention relates to a device for transmitting high-frequency pulses in a certain pattern. A high-frequency signal generator including a modulation control input to provide the output with said pulses in relation to a modulation signal applied to its modulation input and a modulation generator to supply pulses to the modulation input.

This invention also relates to a radio-navigation system comprising such a device.

U.S. Pat. No. 4,455,556 also relates to this type of device and radio-navigation system.

This kind of equipment is required nowadays to be ever more accurate in measuring the time between the received and transmitted pulses. Patterns for these pulses have been designed in order to obtain accurate measurements without overloading the frequency spectrum used.

SUMMARY OF THE INVENTION

This invention puts forward a device for transmitting high-frequency pulses in a certain pattern which are observed despite certain drifts, mainly thermal, which may occur in the response of the high-frequency signal generator to a modulation signal.

To this end, the device for transmitting high-frequency pulses of the kind set out in the preamble is noteworthy in that it comprises a replica circuit to provide a replica of the transmitted pulse, a control circuit to compare this replica with said pattern and to alter the modulation generator signal so that the replica corresponds to the pattern.

The following description, given with reference to the attached drawings, which shall not be limiting, but will give a proper idea of how the invention may be implemented.

BRIEF DESCRIPTION OF THE FIGURES

FIG. 3 shows the timing of various sub-routines governing the operation of the device in FIG. 1;

FIG. 4 represents the initialisation phase of a main program;

FIG. 5 is the flow-chart for the running of interrupt subroutines;

FIG. 7 is the flow-chart for the running of subroutine MLD,

FIG. 8 shows the cycle of the modulation curve obtained by running subroutine MLD.

DESCRIPTION OF THE PREFERRED EMBODIMENT

Figure 1:
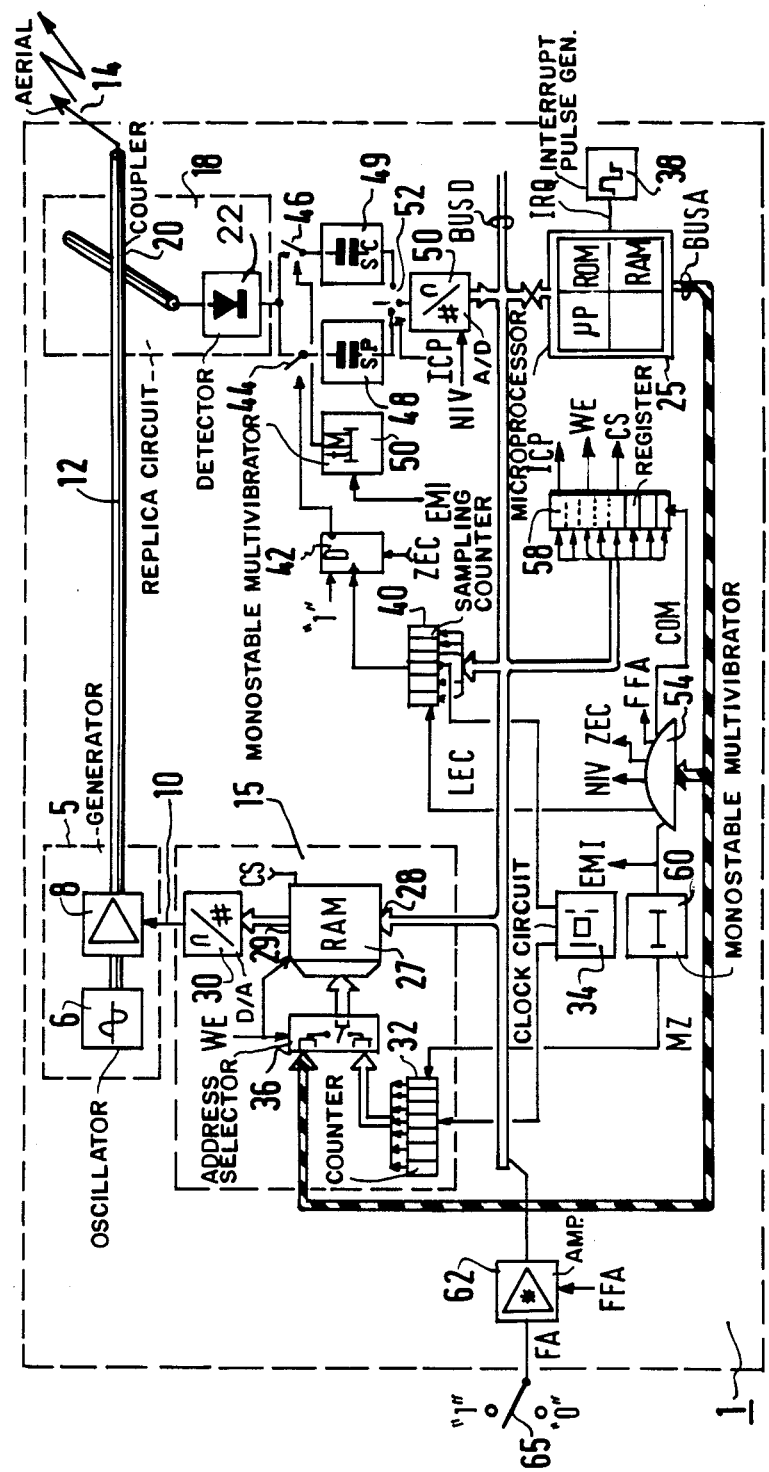
FIG. 1 shows the device of the invention.

In FIG. 1 the device 1 for transmitting high-frequency pulses contains a high-frequency signal generator 5, consisting of an oscillator 6 supplying a continuous high-frequency signal and a high-frequency amplifier 8. The amplifier supply voltage applied to its input 10 is controlled in order to modulate the signal at the output of amplifier 8. This input 10 constitutes the modulation input of generator 5. This method of modulation is illustrated in the diagram headed "35-MHz 6-W NARROW-BAND A-M TRANSMITTER" on page 887 of the ELECTRONIC CIRCUITS MANUAL by John MARKUS, published by McGRAW-HILL BOOK COMPANY. This method may obviously be extrapolated to other frequencies. The amplifier output, which thus constitutes the output of generator 5 is connected via a transmission line 12 to an aerial 14 so that the pulses supplied may be transmitted into space.

Figure 2:
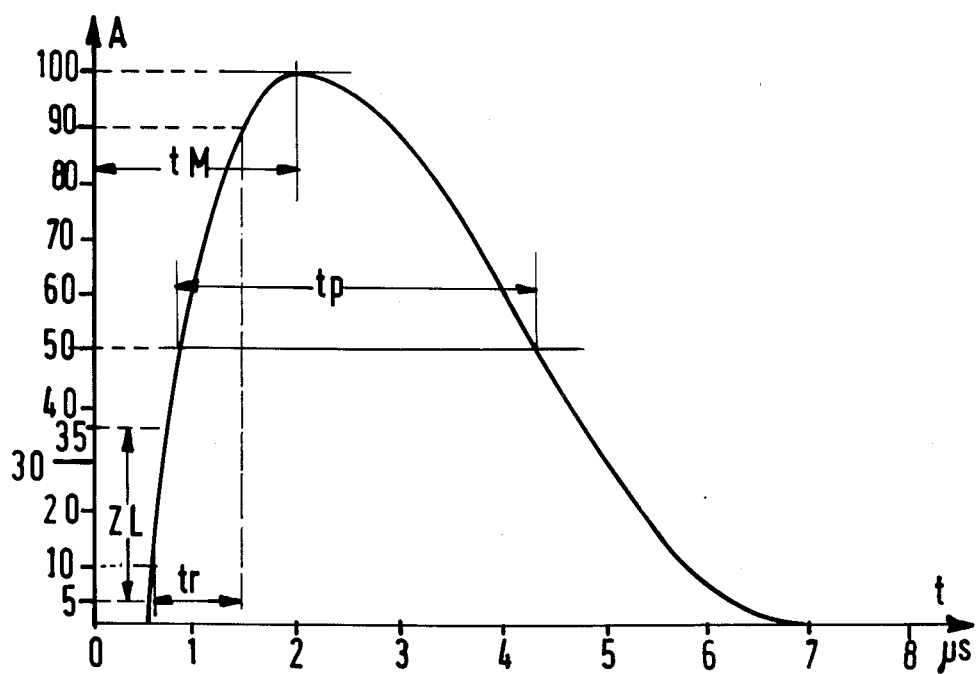
FIG. 2 is the shape of the pulse to be transmitted.

Device 1 described in this example is intended to supply pulses suitable for a precision DME (Distance Measuring Equipment) navigation system. The shape of this pulse is illustrated in FIG. 2, where A is the amplitude of the pulse and t the time. This pulse is characterized by a rise time tr between 10 and 90% of the amplitude, such that tr is less than 1.2 s (in FIG. 2, tr is about 0.82 $\mu$s), a width at 50% tp: tp about 3.5 $\mu$s and in addition there is a dictated linearity area ZL between 5 and 30% of the amplitude. This pulse is produced by a modulation generator 15 supplying its signals to input 10. Although generator 15 can supply signals of the aforementioned pattern, difficulties are met owing to non-linearities and some unreliability in the response of signal generator 5 to the signal applied to its modulation input 10.

In the example described, in which the supply voltage of amplifier 8 is used as the modulation voltage, an initial difficulty arises from the conduction thresholds, variable between 10 and 30 V, which depend upon the transistors used in the amplifier. In other words, the shape of the pulse transmitted is comparable, to within a few slight non-linearities, to that of the voltage applied to input 10 only when its amplitude is higher than the conduction threshold.

In the invention, in order to get rid of these non-linearities and threshold problems, device 1 first has a replica circuit 18 to provide a replica of the transmitted pulse. This circuit consists of a directional coupler 20 coupled to line 12 and a detector 22 thus supplying a voltage representing the shape of the transmitted pulse to the output. Device 1 also comprises a control circuit made up from a microprocessor assembly 25 to compare this replica with said pattern and to alter the modulation signal from modulation generator 15 so that the pattern meets the replica.

Modulation generator 15 as shown in FIG. 1 is quite suitable for alterations to its output signal. The modulation signal is first produced in the form of numeric samples contained in a memory forming part of assembly 25. These samples are then stored in a "transmission" memory 27 fitted with an input 28 to receive the samples to be recorded and an output 29 to supply samples to a numeric-analog converter (D/A) 30, the output of which is connected to the modulation input 10 of generator 5. The read address codes of this transmission memory 27 come from a counter 32 counting the pulses of a clock 34 if a signal MZ applied to its reset so permits. This code passes through an address code selector 36, the position of which is controlled by a signal WE, also applied to the read-write control of transmission memory 27. Thus, for a first value of WE (WE=1), memory 25 is set to read, so that the address of the samples at its output 10 is given by counter 32, for a second value of WE (WE=0), the memory is set to write and the address where the sample present at its input 28 is stored is given by assembly 25 via a shared address line BUSA. The sample to be recorded thus comes from assembly 25, but is transmitted by a shared data line BUSD. It is then clear that the modulation signal may be altered by changing the value of certain samples determined by assembly 25.

This assembly 25 takes the most conventional form of a microprocessor such as here the 6809 made by Motorola, a read-only memory (ROM) to contain the operating program and the value of certain constants like the samples to be stored in memory 25 and also a volatile memory (RAM). This assembly has an input IRQ connected to the output of an interrupt pulse generator 38. The pulses it supplies are periodic, thus periodically interrupting the running of a "main program" governing the operation of assembly 25. These interrupts correspond to the transfer to an "interrupt program". All this will be explained in the course of this description.

In view of the duration of the pulse to be transmitted, only two values per pulse are taken at the output of replica circuit 18. One of them is determined by means of a sampling counter 40 which counts the pulses produced by clock circuit 34, whose zero-transit signal acts via a flip-flop "D" 42 on a switch 44 to close it (briefly). A holding circuit keeps the analog value thus taken. The other value corresponding to the peak of the modulation range of the invention is taken as soon as a switch 46 closes briefly, which occurs after a time tM determined by a monostable circuit 50, counted from the appearance of a transmission triggering signal EMI. This time (see FIG. 2) corresponding to the maximum modulation signal need not be accurately determined since the maximum is usually flat. This peak value is recorded in analog form in holding circuit 49.

An analog-numeric converter (A/D) 50 is fitted to convert the samples stored in circuits 48 and 49. Its input may be linked to outputs sp and sc of circuits 48 and 49 respectively via a selector 52 controlled by a signal ICP. The output of this converter 50 at which the numeric digital samples appear is connected to line BUSD. Signal NIV must be active, however, for this sample to be validated.

An address decoder 54, the inputs of which are connected to line BUSA, provides various signals: EMI, NIV, LEC, ZEC, FFA and COM. Signals EMI and NIV have already been mentioned. Signal COM is used so that a register 58 may record data from line BUSD: when active, signal ZEC zeroes flip-flop 42; when active, signal LEC loads the data from line BUSD into counter 40. It will be noted that signal EMI causes the transmission of a signal MZ produced by a monostable circuit 60 during the time needed for the transmission of a pulse. Signal FFA applied to the control in the passing stage of a three-stage amplifier 62 provides a test of value FA representing the position of a selector 65. The output of amplifier 62 is connected to one wire of line BUSD. Register 58 supplies various signals ICP, WE and CS which have already been mentioned.

The aim of the invention is to provide the pulse in the pattern of FIG. 2 while taking special steps to make said area ZL linear.

The device of the invention operates in the following manner.

It is based on the running of various sub-routines called "MTRA", "MLD" and "MEMI". These sub-routines are called as soon as a "1" appears at the output of generator 38, resulting in pulses I1, I2, I3, I4, I5, etc., (see FIG. 3). These pulses appear periodically (e.g. every 6.38 ms) and it should be noted that the sub-routines always operate in the same order and repetitively. The interval between them must be long enough for the running of these various subroutines. The remaining times between the end of the running of the sub-routines and the appearance of a fresh interrupt pulse may be used for various jobs performed by a main program PP, with which the invention is not concerned. Nevertheless, on the start-up of the device of the invention, one of the jobs is to initialise the content of various memory positions taking part in the operation of the device (see box K0 in FIG. 4). "0" is placed in this box K0 at memory locations NF and FDE; an appendix shows the meaning of the values at these various memory locations.

FIG. 5 is a management flow chart of these various interrupts. As soon as an interrupt pulse appears, the value of FA is tested (box K1), for which signal FFA is generated. If it is not "1", tasks which have nothing to do with the invention will be performed, and they are not therefore described (box K2). The value of NF is then incremented by one unit (box K3) and this value will then be tested (boxes K4 and K5) so that the various sub-routines MTRA, MLD and MEMI may be run as prescribed. IF NF is higher than 2 (box K4), it is zeroed (box K6) and subroutine MEMI is run (box K7). The end of the running of this subroutine results in the return RTI to the main program (box K8). Value NF is tested again if the test shown in box K4 has been negative. If value NF is "2", sub-routine MLD is run (box K9) and a return is made to the main program (box K10). If the test of box K5 is negative, sub-routine MTRA is run (box K11), followed by a return to the main program.

Before the various subroutines mentioned, i.e. MTRA, MLD and MEMI, are described in detail, the various jobs may be summarised as follows:

the purpose of sub-routine MTRA is to calculate the corrections to be made to put the transmitted pulse into the specified pattern.

the purpose of subroutine MLD is to bring about the loading of transmission memory 27 in line with the corrections made in sub-routine MTRA.

the purpose of subroutine MEMI is to cause transmission memory 27 to be read in order properly to modulate the wave transmitted by high-frequency generator 5 and thus to bring about storage of a value of the part of the pulse transmitted to be made linear in holding circuit 48 and of the peak value of the pulse in holding circuit 49.

Each of these sub-routines will now be explained in detail.

SUB-ROUTINE MTRA (SEE FLOW CHART IN FIG. 6)

Figure 6:
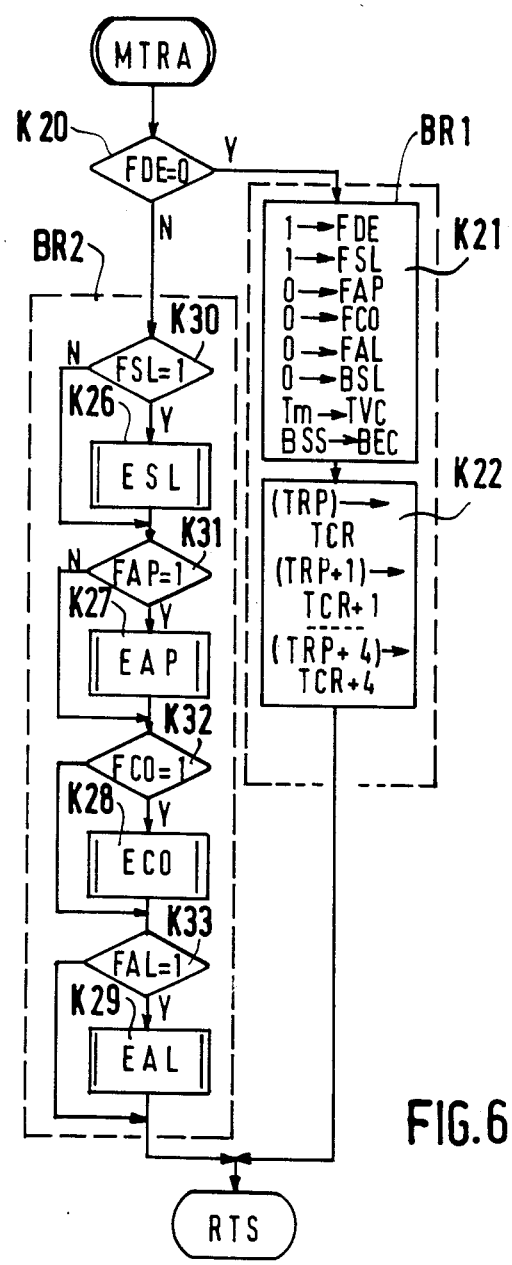
FIG. 6 is the flow-chart for the running of subroutine MTRA.
Figure 9:
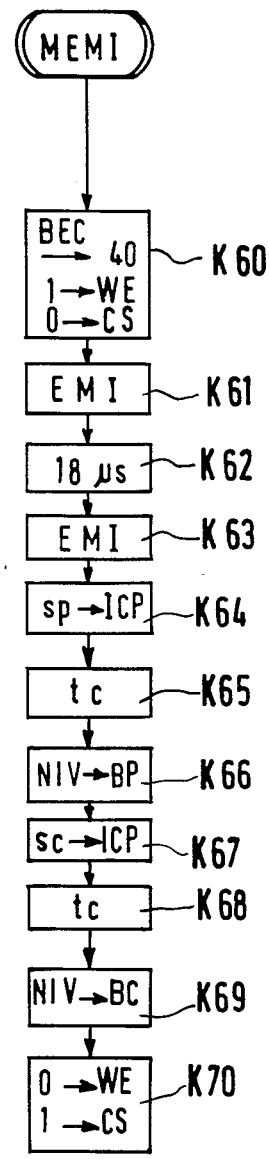
FIG. 9 is the flow-chart for the running of subroutine MEMI.

This subroutine may essentially be broken down into two branches BR1 and BR2. Branch BR1 is executed for FDE=0 (value tested in box K20), i.e. after the start-up of the device and detection of the value "1" of FA. This branch BR1 is an initialisation phase. In FIG. 6, this phase has been broken down into two boxes in favor of:

In a first box K21, various values are initialised, i.e. value "1" is put on quantitites FDE, FSL; value "0" on quantities FAP, FCO, FAL, BSL; value "Tm" on quantity TVC and value "BSS" on quantity BEC.

In a second box K22, five initialisation samples representing the amplitude of the pulse to be transmitted in linear area ZL are read off from a reference table beginning at address TRP. These five samples are put into another table beginning at address TCR, which is where the samples likely to be corrected are placed.

If value FDE is not "0", a transfer is made to branch BR2, which consists of various boxes (K26, K27, K28 and K29) representing the call to various subroutines "ESL", "EAP", "ECO" and "EAL". These subroutines are run only if various tests made on values FSL (K30), FAP (K31), FCO (K32) and FAL (K33) prove positive, i.e. equal to "1". These various sub-routines will be explained later. Sub-routine MLD (see flow chart in FIG. 7 associated with FIG. 8)

This subroutine begins with the calculation of a value BPT equal to 1/16 of a threshold value BSL which essentially corresponds to the voltage which must be applied to the modulation input of amplifier 10 so that the wave issued by generator 5 just begins to be transmitted to aerial 14. This value BPT represents the progression to obtain value BSL starting from zero. Seventeen samples, the value of which varies by increments equal to BPT to span from 0 to 16.BPT (box K41) will be stored at ADME addresses from 0 to 16 in the transmission memory, the address code of which is ADME. Value BSL (box K42) is placed in addresses 17 to 41. The dynamics of the pulse are then calculated from the threshold value. These dynamics are such that $BLI=SFF-BSL$. As is known, the symbol SFF represents the value 256 in the hexadecimal system. The five samples in the table where the address begins at TCR are processed in box K44. Each sample is taken, multiplied by BLI, the value BSL is added and the samples are placed at ADME addresses 42 to 46. The same processing is carried out for the samples of a table in ROM with the address starting at TRP in box K45. The samples thus processed are put at ADME addresses from 47 to 103.

In order to prevent too abrupt a drop in the modulation curve owing to too high a threshold, the following process is performed, beginning at box K46. Value BSL is placed in microprocessor register A. This value is then tested (box K47). If this value is lower than or equal to "4", the value "0" is then placed at all the remaining ADME addresses up to value 255 (box K48). If the value is higher than "4", 4 is subtracted from value A and this value A−4 is placed in the next ADME address (box K49), A is replaced by A−4 (box K50) and the test shown in box K47 is repeated until A assumes a value lower than or equal to "4".

FIG. 8 is the modulation curve obtained by this subroutine MLD. The black arrows from the flow chart to the curve show the contribution of boxes K41, K42, K44, K45, K49 and K48 for each part of the curves separated by a short dash. For the sake of clarity in the drawing, this curve is shown as continuous, although in fact it should be "stepped".

SUB-ROUTINE MEMI (SEE FLOW CHART IN FIG. 9)

This subroutine begins (box K60) by the loading phase of counter 40. The content of this counter becomes equal to value BEC by setting the transmission memory to the read position (WE−1) and by its validation (CS=0). A code is then generated on line BUSA which, recognised by the address bus decoder, gives an active value to EMI (box K61) and this triggers the transmission of the first pulse. The transmission counter is freed by signal MZ at the output of monostable circuit 60. Without taking additional measurements, a sample of the pulse will be taken depending on the content of counter 40 and stored in holding circuit 48, and a sample corresponding to the peak value in holding circuit 49.

Figure 10:
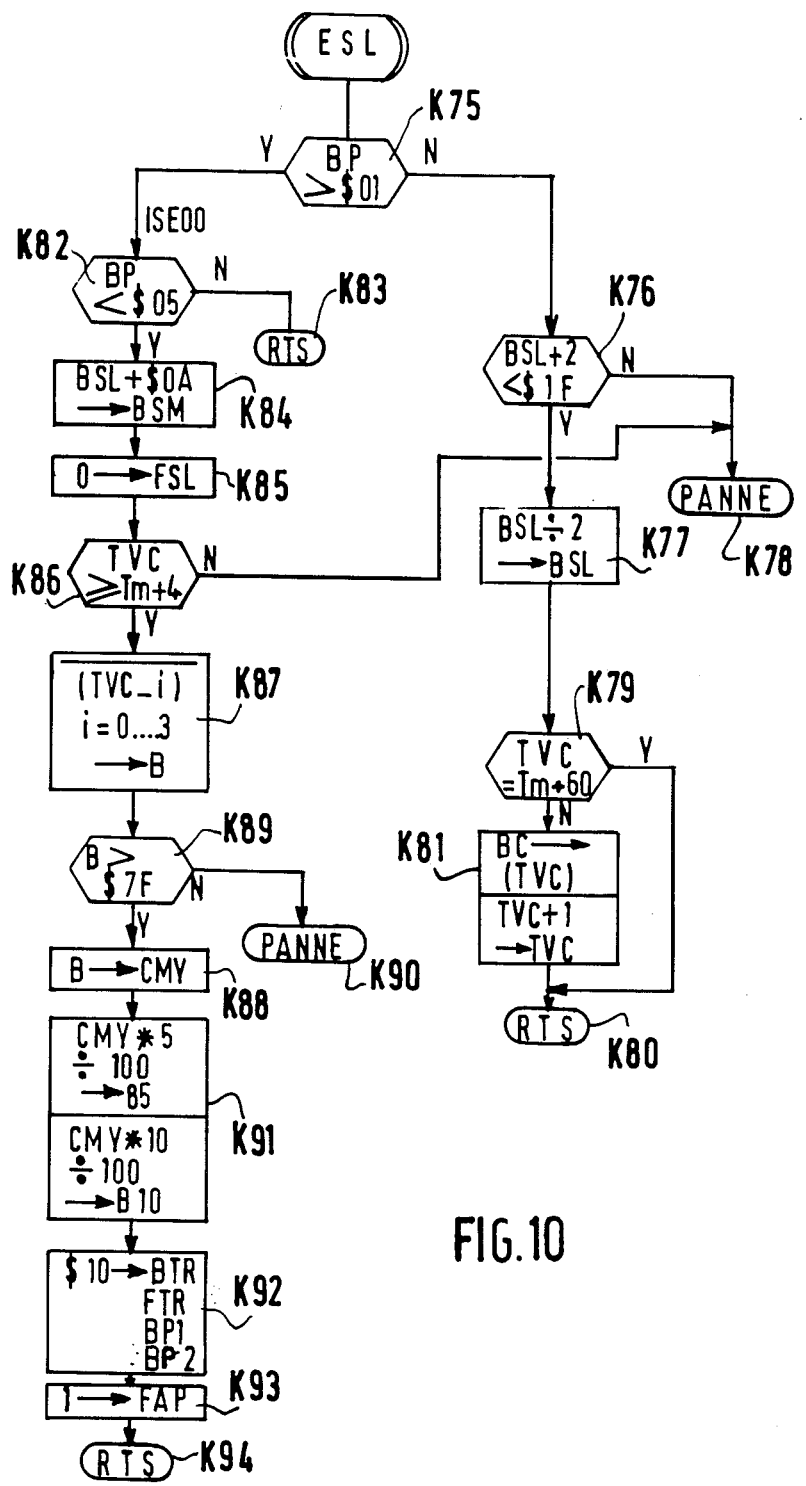
FIG. 10 is the flow-chart for the running of subroutine ESL forming part of subroutine MTRA.
Figure 11:
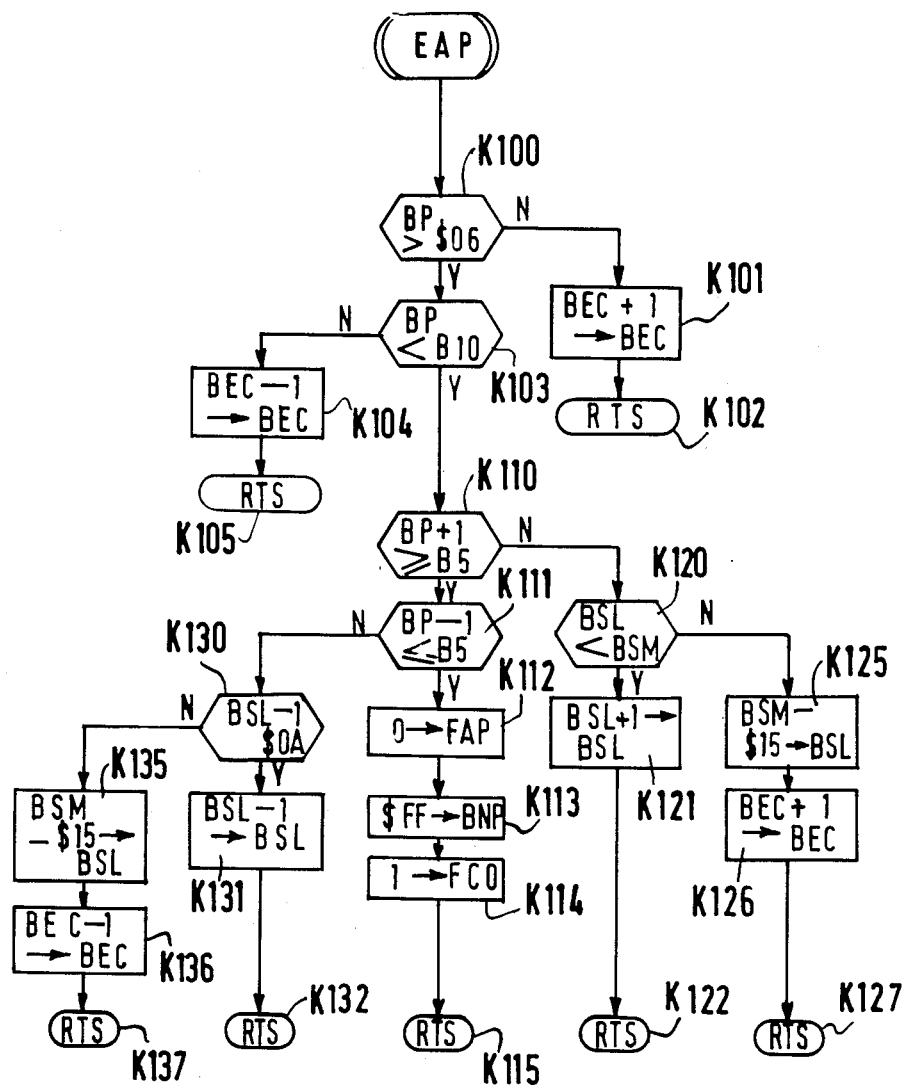
FIG. 11 is the flow-chart for the running of subroutine EAP forming part of subroutine MTRA.

A period of 18 s is then allowed to elapse, corresponding to the transmission mode (box K62) (e.g. mode×FA) before the second pulse is triggered (box K63). The input of analog-numeric converter 50 is then connected to output "sp" of holding circuit 48 and a time "tc" needed for the completion of the analog-numeric conversion is allowed to elapse (box K65). The converted value is placed in a memory BP. To this end, a code is generated on line BUSA which, when decoded by the decoder, supplies an active value of signal NIV (box K66). Converter 50 is then connected to output "SC" of holding circuit 49, generating a value suitable for signal ICP (box K67), the conversion is awaited (box K68) and this value is stored in a memory BC. Then (box K70), the transmission memory is set to write (WE=0) and it is disconnected (CS=1). The sub-routines forming part of subroutine MTRA subroutine ESL is shown in FIG. 10.

This program begins in box K75 which shows a test of value BP, to discover whether it is greater than $01 after conversion. It will be remembered that this value of BP is obtained for a value BSS recorded in counter 40 (see box K21). It corresponds to the start of the pulse. If the value is lower, the test shown in box K76 is made. Before value BSL is incremented by 2 (box K77), therefore, a check is made in box K76 to see whether this value is comparable with an acceptable maximum threshold, $1F in this case. If the test is negative, the device is regarded as having broken down (box K78) and no other action is taken. Once value BSL has been incremented, various peak values BC will be recorded in the table, beginning at address Tm. To start with (box K79), a test is made of the value of TVC which constitutes this table-s pointer. If this value reaches Tm+60, i.e. if 60 peak values have been recorded, the subroutine is regarded as ended, box K80. It should be noticed that the next interrupt pulse triggering subroutine MTRA will cause subroutine ESL to be run, since no change has been made to FSL (see box K30). If the test in box K79 proves negative, a transition is made to box K82, where value BC is placed at the position indicated by the content of pointer TVC, and this pointer is incremented by 1.

Let us return to the test shown in box K75. If it is positive, another test is made (box K82) on value BP; if this value exceeds $05, value BP is disregarded and the execution of subroutine ESL is ended (box K83). If the test indicated in box K82 is positive, a maximum threshold BSM is set which may subsequently not be exceeded. This value is $BSM=BSL+\$0A$ (box K84). Value FSL is then put at "0" (box K85), i.e. it is assumed that the purpose of this subroutine ESL has been achieved and will not normally be subsequently executed. Preparations are then made to calculate 5 and 20% of the peak value before checking whether enough pulses have been recorded (at least 4—box K86). To do so, the value of pointer TVC in relation to Tm+4 is tested. If not, there is a fault and a breakdown is signalled, and a transition is made to box K78. In box K87 it is noted that the average of the last four peak values BC is calculated, the addresses of which are given by pointer TVC. This calculated value is stored in register B of the aforementioned 6809 microprocessor. Before this content of B is transferred into a memory CMY (box K88), a test (box K89) is made to see whether this value is comparable with a predetermined figure, e.g. $7F. If the value of B is too low, it is considered that a fault has occurred and a transition is made to box K90. After transfer, values B5 and B10 are calculated (box K91), respectively representing 5 and 10% of the average peak value contained in CMY. Certain variables BTR, FTR, BP1, BP2 to are initialised at $10. In box K93, value "1" is set on FAP, thus authorising the running of subroutine EAP to the next interrupt triggering subroutine MTRA. The execution of subroutine ESL is then ended, box K94.

SUB-ROUTINE EAP (SEE FLOW CHART IN FIG. 11)

This subroutine consists in determining a point corresponding to 5% of the peak value (value B5 defined in box K91 operating on the sampling time (BEC) and also on BSL).

This subroutine EAP begins at box K100 where a start is made on testing value BP in relation to a minimum, $06 in this instance. If the value BP is not greater than $06, BEC is incremented by 1 (box K101) and then the subroutine is interrupted (box K102). If the test shown in box K100 is positive, value BP is tested (box K103) in relation to value B10. If this value is too great in relation to B10, BEC is decremented by 1 (box K104) and subroutine EAP then ends (box K105). If BP is lower than B10, an attempt is made to obtain a point BP equal to B5 to ±1. To do so, BP+1 and BP−1 are tested in relation to B5 (boxes K110 and K111). If these two tests are satisfactory, value "0" is allocated to FAP (box K112), i.e. subroutine will not be executed at the next interrupt pulse triggering subroutine MTRA. A value BNP is then initialised at $FF (box K113) and the value "1" is allocated to FCO to trigger the running of sub-routine ECO at the next interrupt for program MTRA. Subroutine EAP is thus ended (box K115).

If the test made in box K110 is negative, a test (box K120) is made on value BSL in relation to BSM. If this is lower than the set value (see K85), it is incremented by 1 (box K121) and the subroutine stops there (box K122). If BSL is not lower than BSM, another threshold value $BSL=BSM-\$15$ is calculated (box K125) and BEC is incremented by 1 (box K126) and the subroutine ends (box K127).

If the test shown in box K111 is negative, BSL less 1 is tested (box K130) in relation to a minimum, $0A, for instance. If this reduced value is greater than the minimum, it replaces BSL (box K131) and the subroutine ends (box K132). If the test shown in box K130 is negative, BSL is replaced (box K135) by BSM−$15 and BEC is incremented by 1 (box K136). When the subroutine stops (box K137).

Figure 12A:
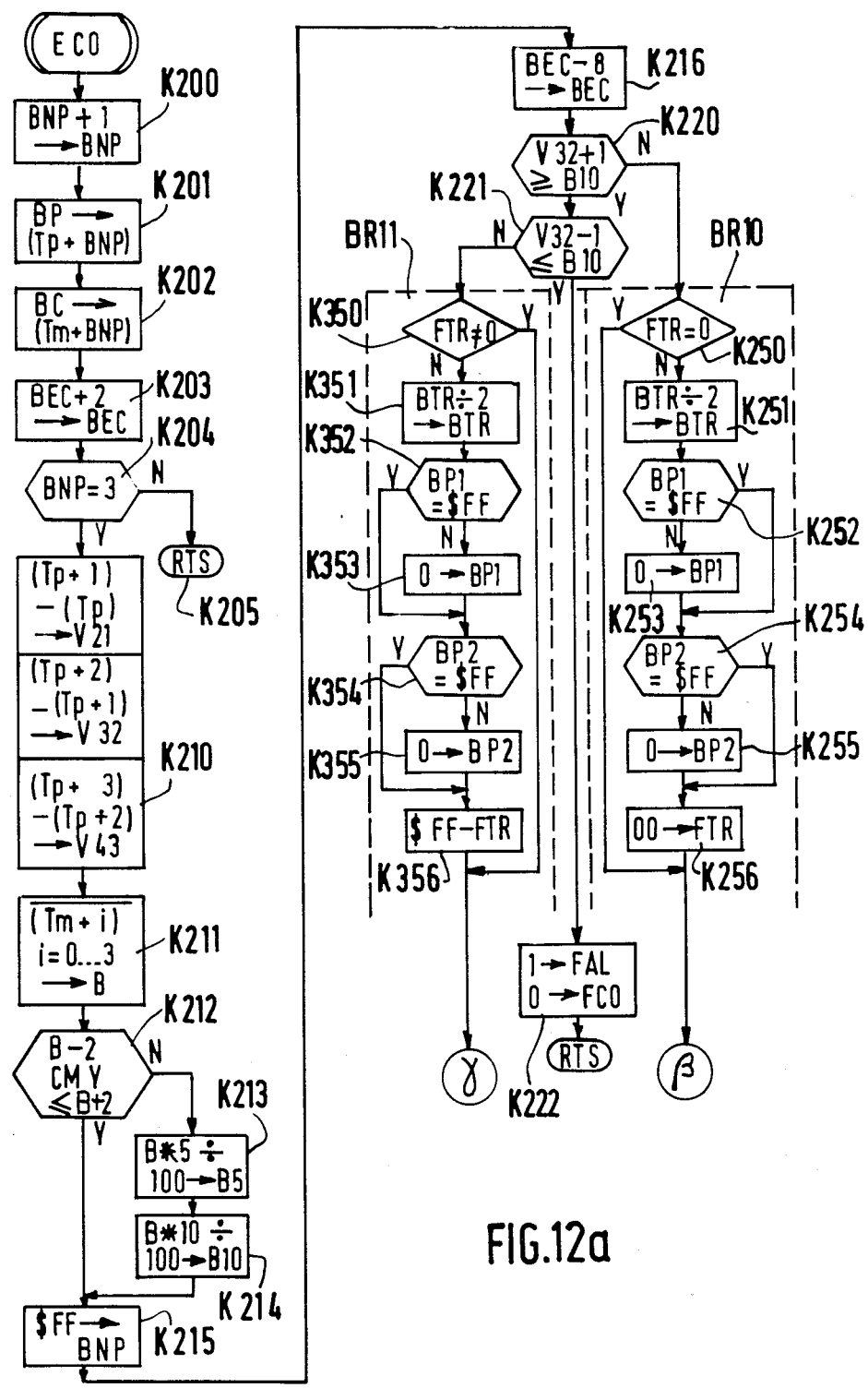
FIGS. 12a and 12b are the flow-charts for the running of subroutine ECO forming part of sub-routine MTRA.
Figure 12B:
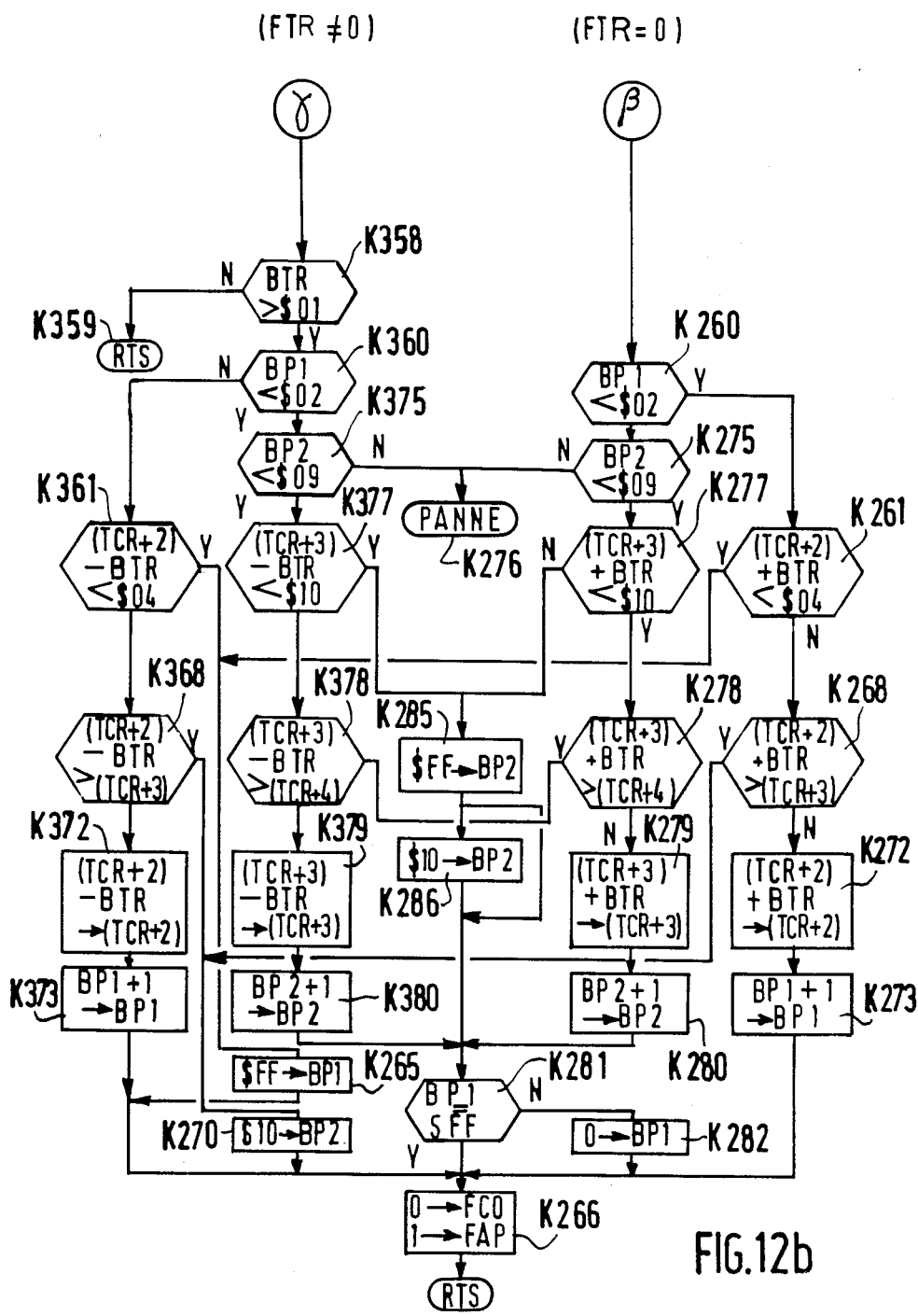
Figure 13:
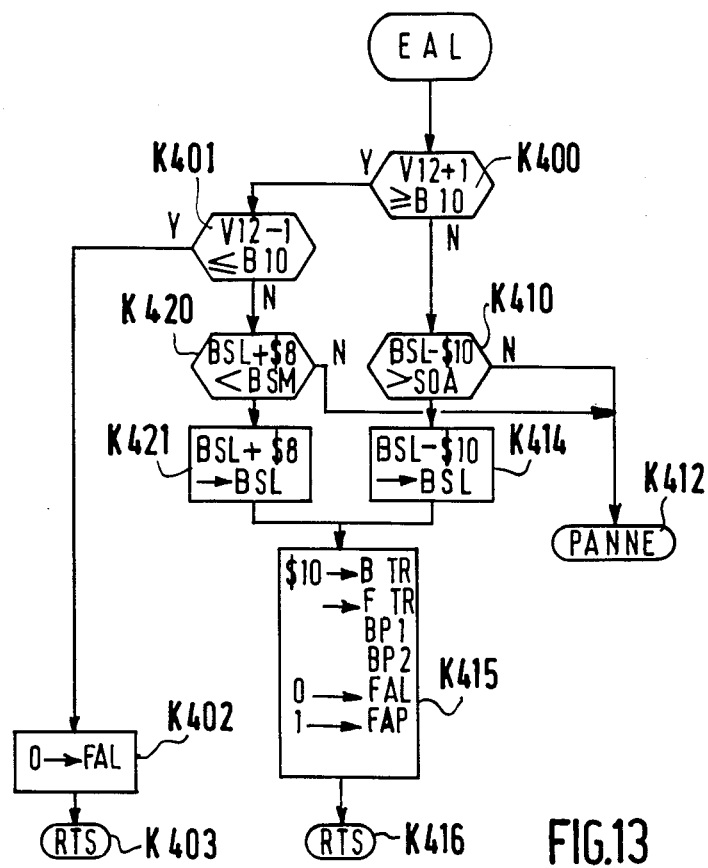
FIG. 13 is the flow-chart for the running of subroutine EAL forming part of subroutine MTRA.

SUB-ROUTINE ECO (SEE FLOW CHART IN FIGS. 12a AND 12b)

The purpose of this sub-routine is to set the points at 5, 15, 25 and 35% and also to set the peak value corresponding to these various values and align the points at 15, 25 and 35%. These points will be set in a table with the starting address Tp and the measured peak value in the same subroutine EMI will be set in the table with the starting address Tm.

In box K200 BNP, which will act as a pointer for these two tables, is incremented by 1. It will be remembered that this value BNP was initialised at $FF (box K133) so that, at this increment, BNP is "0". Then BP is put (box K201) in the table in relation to BNP and BC (box K202). BEC is then incremented by 2 (box K203), corresponding to a following point. BNP is then tested (box K204) to find out whether the four points in question have been recorded. If not, the subroutine is interrupted (box K205). The points are acquired by the successive execution of subroutines MEMI. If the points are acquired, their differences (box K210) are then calculated, i.e. V21 for the difference between points 15 and 5%, and V43 for that between points 35 and 25%; V32 for that between points 25 and 15%.

The average value of the peaks (box K211) is then calculated and compared (box K212) with the value CMY already established (box K88). If this new value is not compatible with the former one, B5 and B10 are recalculated (boxes K213 and K214). The value of BNP is then re-initialised at $FF (box K215) and BEC is put into correspondence with the appearance of the threshold (box K216). If the test shown in box K212 is positive, a direct transition is made to box K215.

Value V32 is then considered and tests K220 and K221 are used to see whether this value is equal to B10 within ±1. If this is so, the subroutine is ended and will no longer be re-started at the next interrupt pulses triggering sub-routine MTRA. To this end, value 1 is allocated to FAL and 0 to FCO (Box K222).

If V32 increased by 1 is greater than or equal to B10, program branch BR10 is run. If V32 less 1 is lower than B10, program branch BR11 is run.

In program branch BR10 a start is made by testing (box K250) the value FTR giving the direction of the correction to be made. If this value differs from "0" a transition is made to box K251 where BTR is divided by 2. A test (box K252) is then made on BP1 in relation to $FF. If this value is different, "0" is allocated to BP1 (box K253). It is then BP2's turn to be tested (box K254) in relation to $FF. If this value is different it is given the value "0" (box K256). A test will then be made on BP1 (box K260, FIG. 12b). If this value is lower than "2", the point to be tested is tested before correction. A test is first made (box 61) to find out whether this point, to which BTR is added, is lower than "4". If so, a transition is made to box K265 where $FF is allocated to BP1 and thence to box K266 so that, at the next interrupt pulse triggering subroutine MTRA, sub-routine EAP is run again. The point to which BTR has been added is then tested (box K268) in relation to the next one. If this value is too high, no correction is made, $10 is allocated to BP2 (box K270) and a transition is made to box K266. If the point to which BTR is added is lower than the value of the next point, the correction is made (box K272) and BP1 is incrementekd by 1 (box K273).

If the test shown in box K260 is negative, a test (box K275) will be made on value BP2. If it is not lower than 09, a transition is made to box K276, where the device is stated to have broken down.

If the test of box K275 is positive, a test (box K277) will be made on the point at 35% (the address of which is TCR+3) to which BTR is added. If the total is lower than $10, an examination will be made to see whether this value exceeds (box K278) the following value (address TCR+4). If not, the correction is made (box K279) and BP2 is incremented by 1 (box K280). From there, a test (box K281) is made on value BP1 in relation to $FF. If it is different, re-initialisation is carried out (box K282) BP1 at "0" and a transition is made to box K266. If the test of box K281 is positive, a direct transition is made to box K266.

The test shown in box K277 may be negative. A transition is then made to box K285 where the value $FF is allocated to BP1 and a transition is made to box K281.

The test shown in box K278 may be positive, when a transition is made to box K286 where the value $10 is allocated to BP2 and a transition is made to box K281.

We now return to program branch BR11 which starts with the test (box K350) on value FTR. If it does not differ from "0", the operations shown for boxes K351, K352, K353, K354 and K355 are performed, identical to those shown for boxes K251, K252, K253, K254 and K255. In box K356 which follows box K355, however, the value $FF is allocated to FTR. It should be noted that if the tests made in boxes K250 and K350 are positive, the program is branched downstream of boxes K256 and K356 respectively.

The operation following that shown in box K356 consists in testing (box K358) the value BTR in relation to "1". If BTR is not greater than it, the subroutine is ended (box K359). If BTR is higher, the test shown in box K360, identical to that of box K260, is carried out. In box K361 a test is made on the value of the point at 15% (the address of which is TCR+2) from which value BTR is subtracted. A positive test causes a transition to box K265 and a negative to box K368 where this point is tested, subtracted from the following value. A positive test causes a transition to box K270 and a negative to box K372 where this subtracted value replaces the previous one (box K372) and the value BP1 is incremented by 1 (box K373) and a transition is subsequently made to box K266.

A return is made to the test shown in box K360, and the test shown in box K375 is performed—it is identical and has the same implications, if it is found negative as that shown in box K275. The following operations, boxes K278, K279 and K280, are the same as those shown in boxes K278, K279 and K280, except, however, that the value BTR is subtracted instead of being added.

SUB-ROUTINE EAL (SEE FLOW CHART OF FIG. 13)

A check is made in boxes K400 and K401 if the value V12 is equal to B10+1. If so, a transition is made to box K402 where value FAL is set at "0" and the process of correction of the invention may be regarded as completed (box K403).

If it is found that value V12+1 is not greater than B10, another test (box K410) is made on the value of BSL, to see whether this value, less $10, is greater than $0A. If not, a breakdown is declared. If so, the reduced value replaces BSL (box K414) and a transition is made to box K415 where initialisations are made for subroutine EAP which will be subsequently run before this subroutine EAL is ended (box K416). These initialisations consist in allocating value $10 to BTR, FTR, BP1 and BP2, value "0" to FAL, and value "1" to FAP.

If value V12−1 is not lower than B10 (box K401), another test is made on value BSL (box K420). The previous value is increased by $8 and compared with the previously determined value BSM. If this increased value remains lower than BSM, it replaces BSL (box K421) and a transition is made to box K415. If the test shown in box K420 is negative, a transition is made to box K412.

APPENDIX

Definition of the variables used in the flow charts.

| NAME | MEANING |
|---|---|
| A | Working register of the 6809 microprocessor. |
| ADME | Address of the transmission memory. |
| B | Working register of the 6809 microprocessor. |
| BEC | Microprocessor register for loading the sampling counter. |
| BC | Memory holding the level of the pulse peak. |
| BLI | BLI = $FF − BSL |
| BNP | Used to count the number of point levels where the level is BP. |
| BP | Memory holding the level of the point sampled for the counter. |
| BPT | Start of the modulation curve (see FIG. 8). |
| BSL | Threshold value. |
| BSM | Absolute maximum of the threshold. |
| BSS | Value to be put into counter 40 to obtain a threshold value. |
| BTR | Amount of correction to be applied to the 25 or 35% points. |
| B5 | 5% of the peak value. |
| B10 | 10% of the peak value. |
| BP1 | Number of times the point at 25% has been corrected. |
| BP2 | Number of times the point at 35% has been corrected. |
| CMY | Average peak value carried out on several values of BC. |
| EAL | Check on the linearity of the point at 5% and 15% by correcting the threshold value ESL. |
| EAP | Acquisition subroutine for the point at 5%. |
| ECO | Subroutine for storing 4 points of area ZL and checking the linearity of the points at 25 and 35%. |
| EMI | Signal to produce a pulse. |
| ESL | Subroutine for determining the threshold value. |
| FA | Determine the position of selector 65. |
| FAL | Indicator for triggering subroutine EAL |
| FAP | Indicator for triggering subroutine EAP |
| FCO | Indicator for triggering subroutine ECO |
| FDE | Variable of the start of the operation of the device. |
| FSL | Indicator for triggering of subroutine ESL. |
| FTR | Shows the direction of correction to be made. |
| ICP | Connects the input of analog-numeric converter 50 to one of outputs sp or sc of 48 and 49. |
| MEMI | Subroutine for reading the transmission memory and measuring the transmitted pulse. |
| MLD | Subroutine for loading transmission memory 27. |
| MTRA | Subroutine for determining the corrections to be made. |
| NIV | Validation signal for the output word of analog-numeric converter 50. |
| NF | Interrupt number. |
| sc | Output of 49. |
| sp | Output of 48 |
| TCR | Starting address of a table where the values to be corrected are put |
| Tm | Starting address of the table where the peak value BC is put |
| Tp | Starting address where value BP is put. |
| TRP | Starting address of a table in which various samples representing the pulse to be transmitted are put. |
| TVC | Value of the address where the peak value BC is put. |

What is claimed is:

1. A device for transmitting high-frequency pulses in a certain pattern, comprising a high-frequency signal generator fitted with a modulation control input to provide said pulses at its output in relation to a modulation signal applied to its modulation input and a modulation generator to supply the modulation signal to the modulation input, in which said device further comprises a replica circuit to provide a replica of the pulse pattern transmitted, a control circuit to compare this replica with said pattern and to alter the modulation signal of the modulation generator so that the pattern corresponds to the replica, said control circuit including a program controlled microprocessor having an operating program divided into subroutines triggered by interrupt pulses supplied by an interrupt generator wherein said subroutines include a first MLD subroutine for loading the transmission memory, a second MEMI subroutine to read the transmission memory to provide the modulation signal and a third MTRA subroutine to determine the changes in said modulation signal to obtain pulses complying with said replica.

2. A device for transmitting high-frequency pulses as claimed in claim 1, in which the high-frequency signal generator consists of a high-frequency oscillator followed by an amplifier with terminals to receive a supply voltage used as a modulation control.

3. A device for transmitting high-frequency pulses as claimed in claim 1, in which the modulation generator includes a transmission memory which is read out to provide, via a numeric-analog converter, the modulation signal and written to undergo the changes made by the control circuit.

4. A device for transmitting high-frequency pulses as claimed in claim 2, in which the modulation generator is made up from a transmission memory which is read out to provide, via a numeric-analog converter, the modulation signal and written to undergo the changes made by the control circuit.

5. A device for transmitting high-frequency pulses as claimed in claim 1, in which third sub-routine MTRA is divided into further sub-routines which may be run in accordance with the value of indicators, said further sub-routines including a sub-routine ESL to determine the threshold value, a second sub-routine EAP to determine, in time and amplitude, a first point to be corrected, a third sub-routine ECO to store the various points to be corrected and to alter the latter to match said pattern, and a fourth sub-routine EAL to alter the first point in relation to the last points corrected.

6. A device for transmitting high-frequency amplitude modulated pulses in a certain pulse pattern, comprising:
   an oscillator for supplying a continuous high-frequency signal;
   a modulation circuit for amplitude modulating said continuous high frequency signal in accordance with a modulation signal; and,
   apparatus for generating said modulation signal including:
   (a) means for amplitude sampling a modulated signal from said modulation circuit;
   (b) a microprocessor connected to receive signal samples from said means for sampling, said microprocessor programmed to carry out the following steps in a sequence determined by an interrupt pulse sequence:
   calculating correction signal values to be made to said modulation circuit control signal for deriving said pattern, including calculating a threshold value for initiating a transmission of said high frequency signal, calculating a set of correction signal values which represent first, second and third segments of said pulses contained in said pulse pattern, and a fourth transition segment for ending said pulse; loading said correction signal values into a temporary storage memory; and reading out said correction signal values;
   (c) interface circuitry connected to receive correction values from said microprocessor, and convert said values to a modulation voltage, whereby said modulation circuit produces an amplitude modulated signal having amplitude pulses corresponding to said pattern.

7. The device of claim 6 further comprising an interrupt generator connected to provide interrupt pulses to said microprocessor, said microprocessor initiating one of said steps after each interrupt pulse is received.

8. The device of claim 6 wherein said means for sampling provides two sample values of each pulse contained in said pattern which occur at different times.

9. The device of claim 6 wherein one of said samples comprises a peak amplitude level of said modulated signal.

10. A device for transmitting high frequency pulses as claimed in claim 6 wherein the high frequency signal oscillator is constituted by a high frequency oscillator followed by an amplifier having terminals to receive a supply voltage which is used as a modulation control.

* * * * *

UNITED STATES PATENT AND TRADEMARK OFFICE
CERTIFICATE OF CORRECTION

PATENT NO. : 4,760,587
DATED : July 26, 1988
INVENTOR(S) : Dominique Ehlinger et al It is certified that error appears in the above-identified patent and that said Letters Patent is hereby corrected as shown below:

IN THE CLAIMS

Claim 6, line 26   change "said" (first occurrence) to --each--

Signed and Sealed this

Fourteenth Day of March, 1989

Attest:

DONALD J. QUIGG

*Attesting Officer*   *Commissioner of Patents and Trademarks*